United States Patent [19]
Akcasu

[11] Patent Number: 5,208,725
[45] Date of Patent: May 4, 1993

[54] HIGH CAPACITANCE STRUCTURE IN A SEMICONDUCTOR DEVICE

[76] Inventor: Osman E. Akcasu, 5068 Glentree Dr., San Jose, Calif. 95129

[21] Appl. No.: 932,425

[22] Filed: Aug. 19, 1992

[51] Int. Cl.$^5$ .................... H01G 4/10; H01L 27/02
[52] U.S. Cl. ................... 361/313; 257/295; 257/307; 257/532
[58] Field of Search .............. 361/311–313; 365/145; 357/51, 71

[56] References Cited

U.S. PATENT DOCUMENTS

| | | | |
|---|---|---|---|
| 3,593,319 | 7/1971 | Barber | 340/173 SP |
| 4,914,546 | 4/1990 | Alter | 361/313 |
| 5,089,878 | 2/1992 | Lee | 357/71 |
| 5,155,658 | 10/1992 | Inam et al. | 361/321 |

Primary Examiner—Donald A. Griffin
Attorney, Agent, or Firm—Townsend and Townsend Khourie and Crew

[57] ABSTRACT

The present invention provides for a capacitor structure on a semiconductor substrate with an enhanced capacitance. The structure has a first layer of conducting strips parallel to each other on the substrate and a second layer of conducting strips which are parallel to each other. The second layer strips overlie and are substantially congruent to the first layer conducting strips in a top view of the semiconductor substrate. The first layer conducting strips are alternately connected to a first node and a second node, and the second layer conducting strips are alternately connected to the first node and the second node in such a manner that each first layer conducting strip and a second layer conducting strip overlying the first layer conducting strip are connected to different nodes. The first and second nodes form two opposing nodes of the capacitor structure.

12 Claims, 2 Drawing Sheets

HIGH CAPACITANCE STRUCTURE IN A SEMICONDUCTOR DEVICE

BACKGROUND OF THE INVENTION

This application is related to the field of semiconductor devices and, more particularly, to capacitor structures in integrated circuits.

In integrated circuit design there are many applications of high-performance, on-chip capacitors. These applications include dynamic random access memories, voltage control oscillators, phase-lock loops, operational amplifiers, and switching capacitors. Such on-chip capacitors can also be used to decouple digital and analog integrated circuits from the noise of the rest of the electrical system.

Heretofore, such capacitors have been fabricated by building parallel plate capacitor structures using two or more layers of metal in the integrated circuit. This type of structure has provided a high-capacitance, stable, predictable and low leakage on-chip capacitor. However, one shortcoming of this structure is that a large area of the chip is required. To reduce the required area, designers have stacked multiple layers of metal which are alternately connected to form the opposing electrical nodes of the capacitor.

The present invention provides for a highly improved capacitor structure, which takes advantage of shrinking semiconductor process geometries. With present day advanced processes, a capacitor structure with two to three times the capacitance of conventional parallel plate structures occupying the same area of a chip is attained.

SUMMARY OF THE INVENTION

The present invention provides for a capacitor structure on a semiconductor substrate. The structure has a first layer of conducting strips parallel to each other on the substrate, and a second layer of conducting strips which are parallel to each other. The second layer strips overlie and are substantially congruent to the first layer conducting strips in a top view of the semiconductor substrate. The first layer conducting strips are alternately connected to a first node and a second node, and the second layer conducting strips are alternately connected to the first node and the second node in such a manner that each first layer conducting strip and a second layer conducting strip overlying the first layer conducting strip are connected to different nodes. The first and second nodes form two opposing nodes of an enhanced capacitor structure. The first and second layers of conducting strips are formed from metal.

The present invention further provides also a material which enhances the capacitance of the capacitor structure of the present invention.

BRIEF DESCRIPTION OF THE DRAWINGS

An understanding of the present invention may be obtained by a perusal of the detailed description of specific embodiments with reference to the following drawings.

DETAILED DESCRIPTION OF SPECIFIC EMBODIMENTS

Figure 1:
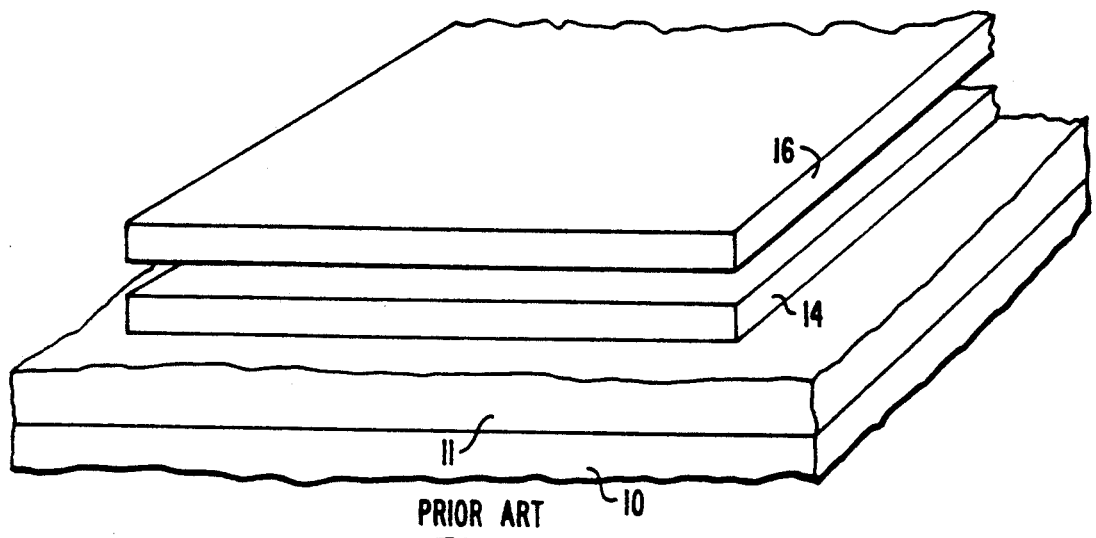
FIG. 1 is a perspective view of a parallel plate capacitor structure in an integrated circuit.

FIG. 1 illustrates the parallel plate capacitor structure used in integrated circuits today. The structure is that of the classic parallel capacitor. Two metal layers 14 and 16 are formed on a semiconductor substrate 10. The lower conducting layer is formed on an insulating layer of silicon dioxide 11. A second layer of silicon dioxide layer (not shown) separates the lower metal layer 14 from the top metal layer 16. The two metal layers form the parallel plates and opposing nodes of the capacitor structure.

Figure 2:
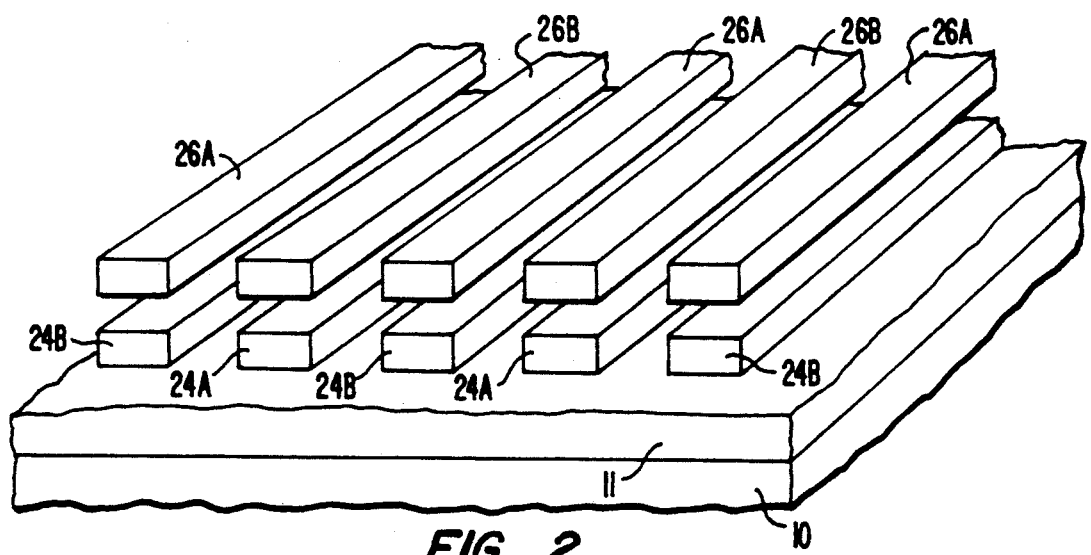
FIG. 2 is a perspective view of an enhanced capacitor structure in an integrated circuit according to one embodiment of the present invention.

FIG. 2 illustrates one embodiment of the present invention. Upon the semiconductor substrate 10 and the insulating layer 11, there are formed two layers of conducting metal strips, each of even number. The first layer is formed by two sets of strips 24A and 24B. The strips are arranged alternately in parallel to each other so that a strip 24B is next to a strip 24A, which is next to a second strip 24B, which, in turn, is next to second strip 24A, and so on. Above and separated from the first layer of conducting strips 24A and 24B by an insulating layer (not shown), is a second layer of conducting strips 26A and 26B. The conducting strips 26A and 26B, respectively, overlie the conducting strips 24B and 24A of the first layer. In other words, the strips 26A and 26B are arranged parallel to the strips 24B and 24A and are identically dimensioned so that the strips 26A and 26B are congruent with the strips 24B and 24A below. The metal strips 26A and 26B are also arranged alternately so that one conducting strip 26A is followed by a conducting strip 26B, followed by a strip 26A, followed by another strip 26B and so on.

All the strips 24A of the first layer and the strips 26A of the second layer are connected to form a common node. Likewise, the strips 24B of the first layer and the strips 26B of the second are connected to form a second common node. These two nodes form the opposing nodes of the enhanced capacitor structure of the present invention. Thus each strip 24A of the first layer connected to node A has an overlying strip 26B connected to the opposing node B, and each strip 24B of the first layer has an overlying strip 26A of the second layer connected to the opposing node A. The number of "A" and "B" strips are equal in each layer.

Figure 3:
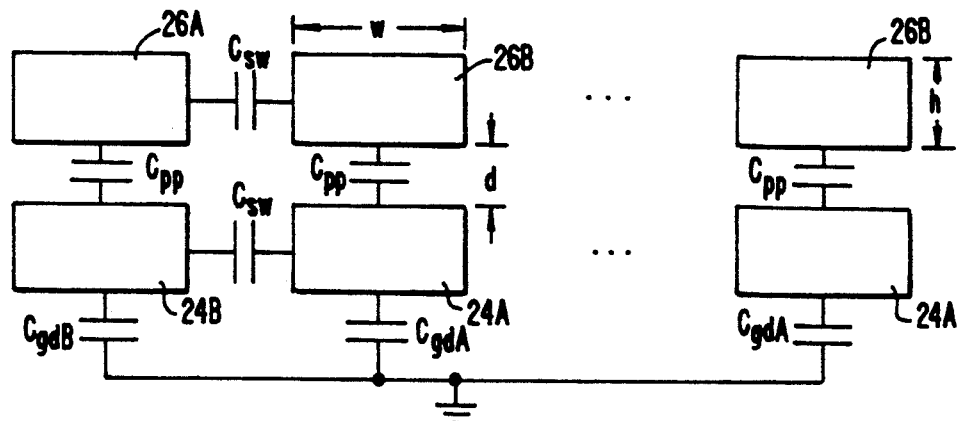
FIG. 3 is a symbolic side view of the high capacitance structure of FIG. 2 showing the various capacitances of the structure.

FIG. 3 is a representational cross-section of the capacitor structure of FIG. 2. Between each strip 24A or 24B of the first layer and its overlying strip 26B or 26A, respectively, there is a parallel plate capacitance, which is symbolically shown as $C_{pp}$. Furthermore, there is a sidewall capacitance between each neighboring pair of strips in each layer, symbolically shown as $C_{sw}$. There is also a capacitance between the strips connected to the nodes A and B and the substrate 10. In FIG. 3, the substrate 10 is assumed to be at ground and the capacitance of each strip 24A with respect to the substrate 10 is illustrated by a capacitance $C_{gdA}$. In a similar fashion, the capacitance between a conducting strip 24B with respect to the substrate is shown by a capacitance $C_{gdB}$.

Semiconductor process technologies have shrinking geometries. In present state-of-the-art technology, a critical dimension of 0.8 microns is common. A critical dimension is the smallest distance in a structure or separation between structures which can be controlled in a process. As critical dimensions shrink, capacitances between structures in the same layer of a process become increasingly significant.

A rough calculation of the capacitance of the structure illustrated in FIG. 2 with respect to capacitance of the parallel plate structure illustrated in FIG. 1 makes this point. With the assumption that the strips of the first and second layers are separated by a distance d and that each of the conducting strips of the first and second layers have a width w, a height h and length l, and that the strips in each layer are separated by a distance $w_1$, a calculation is made on the capacitance of the structure of FIG. 2 without accounting for "fringe" capacitances. With n strips of metal in each layer, the total sidewall capacitance between neighboring strips for the two layers is $$C_{TSW} = 2(n-1)\frac{hl}{w_1}$$

with the sidewall capacitance treated as a parallel plate capacitance and the dielectric constant of the insulating layer between the strips normalized to one. Likewise, the total capacitance between the strips in the first and second layers is $$C_{Tpp} = \frac{nwl}{d}$$

Thus, the total capacitance of the structure is approximately $$C_T^{HCS} \approx 2(n-1)\left(\frac{hl}{w_1}\right) + n\left(\frac{wl}{d}\right)$$

On the other hand, the parallel plate structure found in the prior art yields a total capacitance of $$C_T^{prior} = n(w_1 + w)\frac{l}{d}$$

since $n(w_1+w)l$ is the total area of each plate.

If one assumes that the spacing between the strips in the high capacitance structure is equal to the width of each strip, i.e., $w_1 = w$, then the total capacitance of the enhanced capacitance structure is $$C_T^{HCS} \approx 2(n-1)\left(\frac{hl}{w}\right) + n\left(\frac{wl}{d}\right) =$$

$$n\left(2\frac{hl}{w} + \frac{wl}{d} - 2\frac{hl}{nw}\right),$$

While the prior art parallel plate structure has a total capacitance of $$C_T^{prior} \approx 2\frac{nwl}{d}.$$

As n goes to infinity, we obtain the following limit of the ratio of $$\frac{C_T^{HCS}}{C_T^{prior}}:$$

$$\frac{C_T^{HCS}}{C_T^{prior}} \approx \frac{2\frac{nhl}{w} + \frac{nwl}{d} - 2\frac{nhl}{nw}}{2\frac{nwl}{d}}$$

$$= \frac{hd}{w^2} + \frac{1}{2} - \frac{hd}{nw^2}$$

For large values of n, the last term becomes negligible and $$\frac{C_T^{HCS}}{C_T^{prior}} \approx \frac{hd}{w^2} + \frac{1}{2}$$

$$\frac{hd}{w^2} > \frac{1}{2}$$

and $$\lim_{n\to\infty}\frac{C_T^{HCS}}{C_T^{prior}} > 1 \text{ if } 2hd > w^2 \text{ or } \sqrt{2hd} > w$$

In other words, as semiconductor process technology permits smaller and smaller critical dimensions, the line widths (w) and separation ($w_1$) between the lines become smaller. This shrinkage in line widths and separation allows the sidewall capacitances of the structure of the present invention to become larger. For a process with a given d, the thickness of the interlayer dielectric, and h, the thickness of the metal layers, the calculation above gives a rough estimate when the increase in the sidewall capacitance due to a shrinkage in w, the width and separation between the conducting strips, makes up for the loss of the parallel plate capacitance. For example, a modern BiCMOS process having an interlayer dielectric thickness d of 0.51 microns and a metal thicknesses h of 1.21 microns yields 2hd=1.11

A spacing and width of w smaller than $\sqrt{1.11}$ microns is easily attainable with present processing technologies.

More precise calculations made by computer simulation of the capacitance of the enhanced capacitance structure with respect to the parallel plate structures illustrate the superiority of the present invention. Table A below lists different values for an enhanced capacitor structure with 16 strips in each layer for h, d, w and their resulting ratios of $C_T^{HCS}/C_T^{prior}$.

TABLE A

| n | d | w | $C_T^{HCS}/C_T$ prior |
|---|---|---|---|
| 16 | 0.5 | 0.5 | 0.9374 |
| 16 | 0.5 | 1.0 | 1.177 |
| 16 | 0.5 | 0.5 | 2.343 |
| 16 | 0.5 | 0.25 | 6.518 |

Table A shows that as technologies shrink critical dimensions, the capacitance of the structure according to the present invention increases. For example, for processes having a critical dimension of 0.4 microns, an enhanced capacitance of approximately 3 times the capacitance of a parallel plate structure occupying the same area is possible. Thus the performance of the present invention is enhanced with each with each expected dimensional improvement in semiconductor processing technology.

The present invention has other advantages over the parallel plate structure. Since the present invention has an equal number of strips in each layer connected to the A and B nodes, the A and B nodes are equally capacitively coupled to the substrate 10. For example, the total capacitance of $C_{gdA}$ is equal to $C_{gdB}$ for the first layer. Likewise, the total capacitance of the A and B strips in the second layer to ground are also equal. The capacitor structure of the present invention is highly immune to noise voltage fluctuations on the substrate 10 since both of the opposing nodes A and B equally coupled to the substrate 10. In contrast, present day parallel plate structures must cross-couple the upper and lower plates in some fashion to attain this noise immunity.

The present invention readily allows stacking of multiple layers of conducting strips for increased capacitance. Since each layer has an equal number of "A" and "B" conducting strips, each opposing node is balanced with an additional layer of strips. Thus a third layer of conducting strips may be added with no problem for increasing the capacitance. It should be noted that for the conventional parallel plate structure, an odd number of stacked parallel plates leads to an increase in the balance imbalance of capacitance.

To manufacture the enhanced capacitance structure of the present invention, a first layer of insulating silicon dioxide is either grown or deposited a selected portion of the semiconductor substrate 10. The silicon dioxide layer has a thickness in the range of $10^4$ Angstroms. At these thicknesses pinholes in the silicon dioxide layer, which cause shortcircuits to the substrate 10, are avoided. Furthermore, a thick layer of silicon dioxide helps to decouple the capacitor structure above from the substrate 10.

Figure 4:
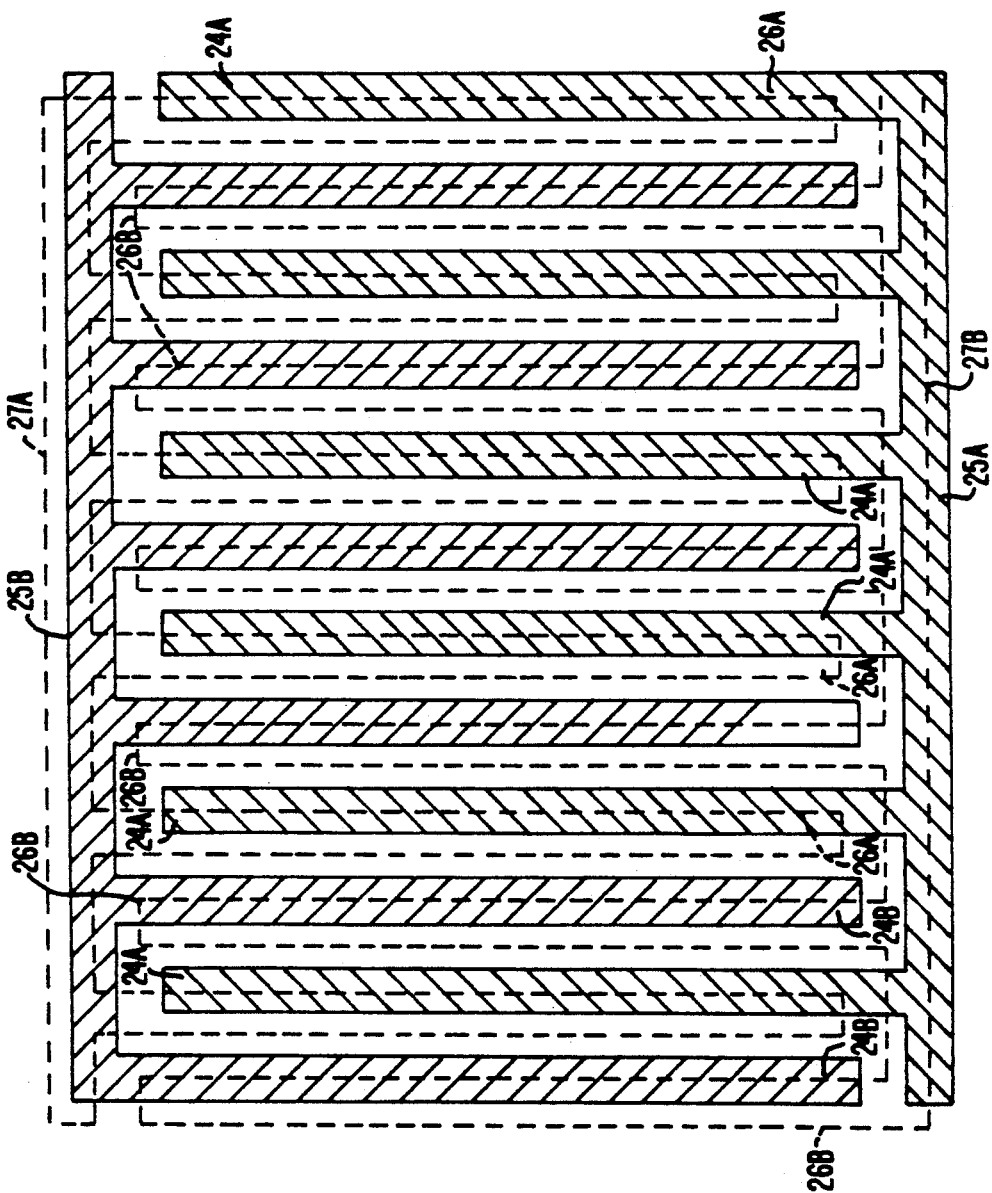
FIG. 4 is a top view of the high capacitance structure of FIG. 2.

A first layer of metal, preferably formed from a refractory metal or metal silicide, such as Al/Si, is deposited. Then the conducting strips 24A and 24B are defined by using wellknown masking and dry etching techniques. As mentioned above, the width and spacing of the conducting strips 24A and 24B are set to the critical dimensions of the process to enhance the sidewall capacitances of the structure, i.e., the strips and spacing between the strips are as narrow as possible. The explanation below with respect to FIG. 4 shows a possible layer of the strips.

A second layer of insulating silicon dioxide is then deposited over delineated conducting strips 24A and 24B. The thickness of this silicon layer is in the range of 2500 to 10,000 Angstroms to be as thin as possible without incurring pinholes. A second layer of metal is then deposited and delineated into the conducting strips 26A and 26B, which lie over and are congruent with the strips 24B and 24A respectively in the lower layer.

Instead of the insulating silicon dioxide layer, a layer of PLZT (lantanium-modified lead zirconate tantalate), a ferro-electric ceramic, may be used between the first and second layers of metal. After the formation of the first metal strips 24A and 24B, the PLZT layer is deposited over the entire substrate. Then by standard photolithography and etching processes the PLZT is removed from the substrate, except over the area in which the enhanced capacitor structure is being formed. Then the second layer of metal and delineated into conducting strips 26A and 26B as described below.

PLZT, which heretofore has been used in the electrooptic field and investigated in some advanced semiconductor structures, is easily adapted to any semiconductor process. The material can be deposited into a very thin layer, and may be easily etched without causing contamination. Metal can be deposited upon the material without problems; and PLZT has a melting point of 800 degrees Centigrade, far higher than that of aluminum, which has been typically used for most metal layers in integrated circuits.

With a PLZT layer, the capacitance is greatly enhanced. PLZT has a dielectric constant of approximately 4,700, in contrast to 3.9 for the dielectric constant of silicon dioxide. Of course, one could use PLZT as an intermediate layer in other capacitor structures to obtain the benefits of its extremely high dielectric constant.

FIG. 4 illustrates in a top view how the strips 24A and 24B of the lower layer and the strips 26A and 26B of the upper layer may be laid out. The lower layer strips 24A and 24B are shaded. The strips 24A are connected by a base strip 25A and the strips 24B are connected by a base strip 25B. The base strips 25A and 25B are located at opposing ends of the strips 24A and 24B so that the strips 24A and 24B are interdigitated. To minimize the space occupied, the base strips 25A and 25B are as narrow as possible, i.e., as wide as the strips 24A and 24B.

The strips 26A and 26B of the second layer are outlined by dotted lines and displaced somewhat to distinguish the upper layer strips 26A and 26B from the lower layer strips 24A and 24B. Of course, the strips 26A and 26B respectively lie directly over the strips 24B and 24A. The strips 26A also have an interconnecting base strip 27A and the strips 26B an interconnecting base strip 27B, as in the case for the lower layer strips. As shown in FIG. 4, the base strips 27A and 27B are also at opposing ends of the strips 26A and 26B. However, the second layer pattern of interdigitated strips 26A and 26B is reversed with respect to the first layer pattern so that the strips which are connected to the opposite nodes "A" and "B" overlie each other.

The interconnections between the "A" strips, 24A and 26A, and the "B" strips, 24B and 26B, are not shown. These interconnections may be made by vias in the insulating layer intermediate the first and second layers of conducting strips. According to the design rules of a typical semiconductor process, such vias are located away from the conducting strips since the interdigitated strips and the base strips are as narrow as the critical dimension as the process allows. To compensate for alignment tolerances between the two conducing layers, a contact pad larger than the width of each conducting strip on each side in the first conducing layer is required.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the appended claims.

What is claimed is:

1. On a semiconductor substrate, a capacitor structure comprising
    a first layer of conducting strips parallel to each other on said substrate; and a second layer of conducting strips parallel to each other, said second layer of conducting strips overlying, electrically separated from and substantially congruent to said first layer of conducting strips in a top view;

said first layer of conducting strips alternately connected to a first node and a second node, said second layer of conducting strips alternately connected to said first node and said second node in such a manner that each first layer conducting strip and a second layer conducting strip overlying said first layer conducting strip are connected to different nodes;

whereby said first and second nodes form two opposing nodes of an enhanced capacitor structure.

2. The capacitor structure of claim 1 wherein both first and second conducting layer strips comprise metal.

3. The capacitor structure of claim 1 wherein said first layer of conducting strips have substantially a width w, a height h, and are substantially separated from each other by said width w, said second layer of conducting strips having substantially the same dimensions and separation, said first layer of conducting strips being separated from said second layer of conducting strips by distance d, the relationship between w, h and d being $$w^2 < 2hd.$$

4. The capacitor structure of claim 1 further comprising a third layer of conducting strips parallel to each other, said third layer of conducting strips overlying and substantially congruent to said second layer of conducting strips in a top view;

said third layer of conducting strips alternately connected to said first and second nodes in such a manner that a third layer of conducting strip overlying said second layer of conducting strip are connected to different nodes.

5. The capacitor structure of claim 1 wherein said conducting strips of said first and second layers have first and second ends, said first layer of conducting strips being alternately connected at said first ends by a first base strip and at said second ends by a second base strip, said second layer of conducting strips connected at said first ends by a first base strip and at said second ends by a second base strip, said first base strip of said first layer being connected to said first base strip of said second layer and said second base strip of said first layer being connected to said second base strip of said second layer so that said conducting strips connected to said first base strip of said second conducting layer lie over said conducting strips connected to said second base strip of said first conducting layer and said conducting strips connected to said second base strip of said second conducting layer lie over said conducting strips connected to said first base strip of said first conducting layer.

6. The capacitor structure of claim 5 further comprising a third layer of conducting strips parallel to each other, said third layer of conducting strips overlying and being substantially congruent to said second layer of conducting strips in a top view;

said third layer of conducting strips being alternatively connected to said first and second nodes in such a manner that third layer conducting strips overlying said second layer conducting strips are connected to different nodes.

7. The capacitor structure of claim 6 further comprising a fourth layer of conducting strips parallel to each other, said fourth layer of conducting strips overlying and substantially congruent to said third layer of conducting strips in a top view;

said fourth layer of conducting strips alternately connected to said first and second nodes in such a manner that third layer conducting strips overlying said second layer conducting strips are connected to the same nodes.

8. The capacitor structure of claim 1 wherein the number of first conducting layer strips equal the number of second conducting layer strips, and the number of first conducting layer strips connected to said first node is equal to the number of first conducting layer strips connected to said second node.

9. The capacitor structure of claim 1 wherein said first and second layer of conducting strips are separated by an insulating layer of silicon dioxide.

10. The capacitor structure of claim 1 wherein said first and second layer of conducting strips are separated by an insulating layer of a ferro-electric ceramic having an extremely high dielectric constant.

11. The capacitor structure of claim 10 wherein said ferro-electric ceramic comprises PLZT.

12. The capacitor structure of claim 1 wherein said capacitor structure is formed as part of an integrated circuit formed on said semiconductor substrate.

* * * * *